United States Patent
Nagasawa et al.

(10) Patent No.: US 12,027,428 B2
(45) Date of Patent: Jul. 2, 2024

(54) SEMICONDUCTOR WAFER EVALUATION METHOD AND MANUFACTURING METHOD AND SEMICONDUCTOR WAFER MANUFACTURING PROCESS MANAGEMENT METHOD

(71) Applicant: SUMCO CORPORATION, Tokyo (JP)

(72) Inventors: Takahiro Nagasawa, Saga (JP); Masahiro Murakami, Saga (JP)

(73) Assignee: SUMCO CORPORATION, Tokyo (JP)

( * ) Notice: Subject to any disclaimer, the term of this patent is extended or adjusted under 35 U.S.C. 154(b) by 498 days.

(21) Appl. No.: 17/417,853

(22) PCT Filed: Nov. 11, 2019

(86) PCT No.: PCT/JP2019/044039
§ 371 (c)(1),
(2) Date: Jun. 24, 2021

(87) PCT Pub. No.: WO2020/137194
PCT Pub. Date: Jul. 2, 2020

(65) Prior Publication Data
US 2022/0102225 A1 Mar. 31, 2022

(30) Foreign Application Priority Data
Dec. 27, 2018 (JP) ................. 2018-245448

(51) Int. Cl.
*H01L 21/20* (2006.01)
*G01N 21/956* (2006.01)
(Continued)

(52) U.S. Cl.
CPC .......... *H01L 22/20* (2013.01); *G01N 21/956* (2013.01); *H01L 21/02024* (2013.01); *H01L 21/02052* (2013.01)

(58) Field of Classification Search
CPC ......... B08B 1/002; B08B 1/005; B08B 1/006; B08B 1/02; D06F 39/00; G01N 21/94;
(Continued)

(56) References Cited

U.S. PATENT DOCUMENTS

2012/0100701 A1 4/2012 Kawasaki
2018/0136279 A1 5/2018 Nagasawa et al.

FOREIGN PATENT DOCUMENTS

CN 108027330 A 5/2018
CN 108376655 8/2018
(Continued)

OTHER PUBLICATIONS

IPRP and Written Opinion issued in WIPO Patent Application No. PCT/JP2019/044039, Jun. 16, 2021, English translation.
(Continued)

*Primary Examiner* — Tri T Ton
(74) *Attorney, Agent, or Firm* — GREENBLUM & BERNSTEIN, P.L.C.

(57) ABSTRACT

Provided is an evaluation method of a semiconductor wafer having a polished surface, the method including a cleaning process of cleaning the semiconductor wafer with one or more kinds of cleaning liquid, measuring an LPD of the polished surface both before and after the cleaning process with a laser surface inspection device, and distinguishing the type of defect or foreign substance measured as the LPD, based on measurement results obtained in the measuring, according to distinguishing standards shown in Table A.

(Continued)

TABLE A

| Measurement Result | Type of Defect or Foreign Substance |
|---|---|
| LPD where a detection size X before the cleaning process and a detection size Y after the cleaning process fulfill the relationship X < Y | PID |
| LPD that is detected before the cleaning process but is not detected after the cleaning process | Normal particle |
| LPD where a detection size X before the cleaning process and a detection size Y after the cleaning process fulfill the relationship X ≥ Y | Firmly-adherent particle |

9 Claims, 1 Drawing Sheet

(51) Int. Cl.
  *H01L 21/02* (2006.01)
  *H01L 21/66* (2006.01)
(58) Field of Classification Search
  CPC .............. G01N 21/9501; G01N 21/956; H01L
    21/02024; H01L 21/02052; H01L 22/20;
    H01L 22/12; C08G 18/10; C08G 18/324;
      C08G 18/4829; C08G 18/7664; C08G
        18/797; C08G 2110/0008; C08G
      2110/0033; C08G 2110/0066; C08G
    2120/00; G09G 2310/08; G09G 2320/02;
      G09G 2330/021; G09G 3/3266; G09G
      3/3275; H10K 59/131; H10K 59/352;
                        H10K 59/353
  See application file for complete search history.

(56) References Cited

FOREIGN PATENT DOCUMENTS

| JP | 05-291225 | 11/1993 |
| JP | 10-163284 | 6/1998 |
| JP | H11-145088 A | 5/1999 |
| JP | 2000-114333 | 4/2000 |
| JP | 2001-050907 A | 2/2001 |
| JP | 2005-063984 | 3/2005 |
| JP | 2005-166846 | 6/2005 |
| JP | 3737585 | 1/2006 |
| JP | 2007-123543 | 5/2007 |
| JP | 2016-212009 | 12/2016 |
| JP | 2018-082004 | 5/2018 |
| KR | 10-0821765 B1 | 4/2008 |
| KR | 10-1759878 B1 | 7/2017 |
| TW | 396477 B | 7/2000 |
| TW | 201708811 | 3/2017 |

OTHER PUBLICATIONS

Office Action issued in KR Patent Application No. 10-2021-7018302, Jan. 18, 2023, English translation.
Office Action issued in Japanese Patent Application No. 2018-245448, Dec. 7, 2021, English translation.
Office Action issued in Taiwan Counterpart Patent Appl. No. 108140612, dated Sep. 9, 2020, along with an English translation thereof.
Official Communication issued in International Bureau of WIPO Patent Application No. PCT/JP2019/044039, dated Jan. 7, 2020, along with an English translation thereof.
Official Communication issued in International Bureau of WIPO Patent Application No. PCT/JP2019/044039, dated Jan. 7, 2020.
Office Action issued in CN Patent Application No. 201980086184.9, Nov. 7, 2023, English translation.
Office Action issued in DE Patent Application No. 112019006459.2, Jan. 30, 2024, English excerpt.

(a)　　　　　(b)

(a)　　　　　(b)

(a)　　　　　(b)

SEMICONDUCTOR WAFER EVALUATION METHOD AND MANUFACTURING METHOD AND SEMICONDUCTOR WAFER MANUFACTURING PROCESS MANAGEMENT METHOD

CROSS REFERENCE TO RELATED APPLICATIONS

The present application claims priority from Japanese Patent Application No. 2018-245448, filed on Dec. 27, 2018, the entire disclosure of which is particularly incorporated herein.

FIELD OF THE INVENTION

The present invention relates to a semiconductor wafer evaluation method and a semiconductor wafer evaluation manufacturing method as well as a semiconductor wafer manufacturing process management method, and specifically relates to an evaluation method and a manufacturing method of a semiconductor wafer having a polished surface as well as a manufacturing process management method of a semiconductor wafer having a polished surface.

BACKGROUND OF THE INVENTION

A laser surface inspection device (see, for example, Japanese Patent Laid-open Publication No. 2016-212009 (the entire disclosure of which is particularly incorporated herein)) is widely used as a device for evaluating a semiconductor wafer.

SUMMARY OF THE INVENTION

Evaluation with the laser surface inspection device is conducted by irradiating a surface of a semiconductor wafer to be evaluated with light and detecting radiated light (scattered light and reflected light) from the surface, whereby the presence and/or size of defects and foreign substances on the semiconductor wafer are evaluated.

Among semiconductor wafers, a polished wafer is a semiconductor wafer that is manufactured by going through various processes including a polishing process, and the surface of the wafer (outermost surface) is a polished surface. Herein, "polished surface" refers to a surface that has been mirror polished (also called mirror finished). Various kinds of defects and foreign substances may be present on the polished surface. What causes these defects and foreign substances to occur varies, and therefore solutions for reducing defects and foreign substances (reprocessing, process management, and the like) also vary. Therefore, when the type of defect or foreign substance present on a polished surface can be distinguished, employing a solution tailored to that type enables a polished wafer having few defects or foreign substances to be provided.

One aspect of the present invention provides a novel evaluation method that is capable of distinguishing a type of a defect or foreign substance that is present on a polished surface of a polished wafer.

The defect and foreign substance present on the polished surface of the polished wafer is broadly classified into, generally, particles and polishing induced defects (PID). Particles are foreign substances that are adhered to the polished surface and PID are convex defects introduced in a polishing process. Because particles are foreign substances adhered to the surface of the polished surface, conventionally it is believed that the particles can be readily removed by a cleaning treatment ordinarily performed on a semiconductor wafer. In contrast, the PID are defects and therefore would not be removed by such a cleaning treatment. In view of this, in order to distinguish between particles and PID, a case may be considered where a feature that is measured as a light point defect (LPD) prior to a given cleaning process but is not measured after the cleaning process is distinguished to be a particle and a feature that is measured as an LPD both before and after the cleaning process is distinguished to be a PID. However, during repeated investigation, the inventors newly discovered that a phenomenon occurs wherein the number of residual particles after a given cleaning process increases when the cleaning power of the cleaning process is reduced due to, for example, the same cleaning liquid being used repeatedly and deteriorating. In this regard, the inventors decided to categorize a particle removed by a given cleaning process (cleaning process to be investigated) as a "normal particle" and a particle that remains after a given cleaning process as a "firmly-adherent particle." When normal particles and firmly-adherent particles can be distinguished, a reduction in the cleaning power of a given cleaning process can be detected by, for example, setting a number of firmly-adherent particles as a parameter or the like, and a time when the cleaning liquid used in the cleaning process should be switched, for example, can be ascertained. However, the defect and foreign substance measured as an LPD after a given cleaning process is not limited to firmly-adherent particles and may also be a PID. Accordingly, in order to detect a reduction in the cleaning power of a cleaning process in the manner described above, being able to distinguish between firmly-adherent particles and PID is also required.

Given the above, and as a result of thorough further investigation in order to distinguish between PID, normal particles, and firmly-adherent particles, the inventors devised the evaluation method below.

That is, one aspect of the present invention relates to:
an evaluation method of a semiconductor wafer (hereafter also referred to simply as an "evaluation method"),
which is an evaluation method of a semiconductor wafer having a polished surface (hereafter also referred to simply as an "evaluation method"), and
includes:
a cleaning process of cleaning the semiconductor wafer with one or more kinds of cleaning liquid;
measuring an LPD of the polished surface both before and after the cleaning process with a laser surface inspection device; and
distinguishing the type of defect or foreign substance measured as the LPD, based on measurement results obtained in the above measuring, according to the following distinguishing standards.

TABLE A

| Measurement Result | Type of Defect or Foreign Substance |
|---|---|
| LPD where a detection size X before the cleaning process and a detection size Y after the cleaning process fulfill the relationship X < Y | PID |
| LPD that is detected before the cleaning process but is not detected after the cleaning process | Normal particle |

TABLE A-continued

| Measurement Result | Type of Defect or Foreign Substance |
|---|---|
| LPD where a detection size X before the cleaning process and a detection size Y after the cleaning process fulfill the relationship X ≥ Y | Firmly-adherent particle |

A "normal particle" is, as described above, a foreign substance that can be removed by cleaning with a given cleaning process (a cleaning process to be investigated). In the above evaluation method, an LPD that is detected before the cleaning process but is not detected after the cleaning process is distinguished as a "normal particle."

In contrast, defects or foreign substances that are not removed by the above cleaning process are "firmly-adherent particles" and "PID." Since firmly-adherent particles and PID are not removed by the above cleaning process, both are measured as LPD.

In this regard, investigation by the inventors ascertained that for "firmly-adherent particles," either a detection size does not change before and after a cleaning process or the detection size after the cleaning process is smaller. The reason is conjectured as that a portion of the firmly-adherent particles dissolve and become smaller due to the cleaning process.

On the other hand, investigation by the inventors ascertained that for "PID," unlike for firmly-adherent particles, the detection size after the cleaning process is larger than the detection size before the cleaning process. PID playing a role similar to a mask when the polished surface is etched by the cleaning process and selectively being left behind is conjectured to be the reason for this.

"PID," "normal particles," and "firmly-adherent particles" can be distinguished according to the distinguishing standards shown in Table A above, which are determined based on phenomena newly ascertained by the investigation described above by the inventors. As a result, reduction of the cleaning power of a cleaning process can be detected, for example. This enables deciding the necessity of switching cleaning liquid and/or enables judging whether a post-cleaning process semiconductor wafer needs to be cleaned again. Moreover, setting the number of PID measured as LPD as a parameter, for example, also enables judging the necessity of re-polishing and/or the necessity of process management of a polishing process, for example.

In one aspect, the above cleaning process can be a cleaning process performed with a cleaning liquid containing one or more kinds of inorganic acid.

In one aspect, the above cleaning process can include HF cleaning and SC-1 cleaning.

One aspect of the present invention relates to:
a manufacturing method of a semiconductor wafer having a polished surface (hereafter also referred to simply as a "manufacturing method"),
which includes:
mirror polishing a semiconductor wafer to form a polished surface;
performing a cleaning process of cleaning the semiconductor wafer provided with the polished surface with one or more kinds of cleaning liquid;
measuring an LPD of the polished surface both before and after the cleaning process with a laser surface inspection device; and
distinguishing the type of defect or foreign substance measured as the LPD, based on measurement results obtained in the above measuring, according to the distinguishing standards shown in Table A, and
further includes:
subjecting a semiconductor wafer that is judged as an acceptable product based on the results of the above distinguishing to a preparation process that delivers the semiconductor wafer as a finished product.

In one aspect, the above manufacturing method can further include subjecting to a reprocessing process a semiconductor wafer that is judged as an unacceptable product as a result of the above distinguishing, and subjecting a post-reprocessing process semiconductor wafer to a preparation process that delivers the semiconductor wafer as a finished product.

In one aspect, the above reprocessing process can be at least one process selected from the group consisting of a polishing process and a cleaning process.

One aspect of the present invention relates to:
a semiconductor wafer manufacturing process management method (hereafter also referred to simply as a "management method"),
wherein a manufacturing process to be managed includes:
performing a polishing process of mirror polishing a semiconductor wafer to form a polished surface; and
performing a cleaning process of cleaning the semiconductor wafer provided with the polished surface with one or more kinds of cleaning liquid,
the method includes:
measuring an LPD of the polished surface both before and after the cleaning process with a laser surface inspection device; and
distinguishing the type of defect or foreign substance measured as the LPD, based on measurement results obtained in the above measuring, according to the distinguishing standards shown in Table A, and
the method further includes:
judging the necessity of one or both of managing the polishing process and managing the cleaning process on the basis of the results of the above distinguishing.

In one aspect, the above management of the cleaning process can include switching the one or more kinds of cleaning liquid used in the above cleaning process.

According to one aspect of the present invention, the type of various defects and foreign substances present on the polished surface of the polished wafer can be distinguished.

MODE FOR CARRYING OUT THE INVENTION

[Semiconductor Wafer Evaluation Method]

Figure 1:
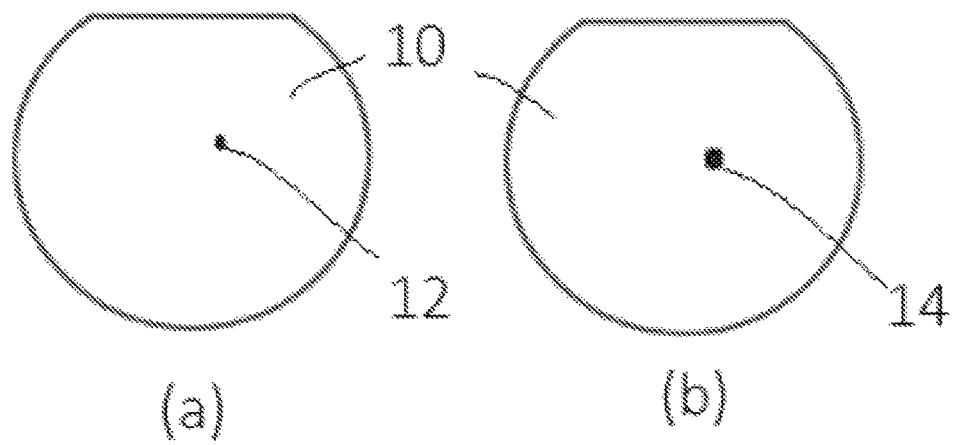
FIGS. 1(a) and 1(b) graphically illustrate measurement determination of PID.

One aspect of the present invention relates to an evaluation method of a semiconductor wafer having a polished surface, which includes a cleaning process of cleaning the semiconductor wafer with one or more kinds of cleaning liquid, measuring an LPD of the polished surface both before and after the cleaning process with a laser surface inspection device, and distinguishing the type of defect or foreign substance measured as the LPD, based on measurement results obtained in the above measuring, according to distinguishing standards shown in Table A. Hereafter, the above evaluation method is described in further detail.

<Semiconductor Wafer to be Evaluated>

The semiconductor wafer to be evaluated by the above evaluation method is a semiconductor wafer having a polished surface (a surface that has been mirror polished), i.e., a polished wafer. The semiconductor wafer can be various kinds of semiconductor wafer, such as a silicon wafer. The diameter of the wafer can be 200 mm, 300 mm, or 450 mm, for example, but is not particularly limited.

<Cleaning Process>

In the above evaluation method, the semiconductor wafer to be evaluated undergoes LPD measurement with a laser surface inspection device both before and after the cleaning process is carried out. In the cleaning process that is performed between these two LPD measurements, the semiconductor wafer is cleaned with one or more kinds of cleaning liquid. such a cleaning process can use, as the cleaning liquid, one kind or two or more kinds of cleaning liquid ordinarily used in cleaning a semiconductor wafer, such as a cleaning liquid containing one or more kinds of inorganic acids. Examples of the cleaning liquid containing an inorganic acid may include an aqueous solution containing one or more kinds of inorganic acids such as hydrogen fluoride (HF), $H_2O_2$, hydrochloric acid, sulfuric acid, and nitric acid. The concentration of inorganic acid in the cleaning liquid can be a concentration that is ordinarily used in cleaning a semiconductor wafer and is not particularly limited. In one aspect, the cleaning process that is performed between the two LPD measurements can include HF cleaning and SC-1 cleaning. "HF cleaning" is a cleaning treatment with hydrofluoric acid (aqueous solution of hydrogen fluoride), and the concentration of hydrogen fluoride in the hydrofluoric acid may be 0.05 to 5 mass %, for example. "SC-1 cleaning (Standard Cleaning-1)" is a cleaning treatment with an SC1 liquid in which ammonia water, hydrogen peroxide solution, and $H_2O$ are mixed. The ammonia concentration in the ammonia water may be 25 to 35 mass %, for example, and the $H_2O_2$ concentration in the hydrogen peroxide solution may be 25 to 35 mass %, for example. A mixing ratio of the ammonia water, hydrogen peroxide solution, and $H_2O$ of the SC1 liquid may be an ammonia water volume of 0.1 to 1 and a water volume of 5 to 15 with the volume of hydrogen peroxide solution as a reference (treated as "1"), for example. In addition, the cleaning can be conducted by immersing the wafer in each cleaning liquid. An immersion time for the wafer in each cleaning liquid can be set to 0.5 to 10 minutes, for example, but is not particularly limited and may be decided in accordance with the cleaning level as needed.

<LPD Measurement>

The LPD measurement is conducted using a laser surface inspection device. A laser surface inspection device with a known configuration as a device for inspecting a semiconductor wafer surface, which is also called a light-scattering surface inspection device, a surface inspector, or the like, can be used without any limitation whatever as the laser surface inspection device. Ordinarily, the laser surface inspection device uses laser light to scan the surface of the semiconductor wafer to be evaluated and detects a defect or abnormality on the wafer surface as an LPD using radiated light (scattered light or reflected light). In addition, the size and/or position of the defect or abnormality can be recognized by measuring the radiated light from the LPD. Ultraviolet light, visible light, or the like can be used as the laser light, and the wavelength of the laser light is not particularly limited. Ultraviolet light is taken to refer to light in a wavelength range of less than 400 nm, and visible light is taken to refer to light in a wavelength range of 400 to 600 nm. An analysis portion of the laser surface inspection device ordinarily converts the size of the LPD detected by the laser surface inspection device into the size of the defect or abnormality, based on a correlation expression for the size of a standard particle and the size of an LPD produced by the standard particle. An analysis portion making such a conversion ordinarily includes a personal computer (PC) with conversion software installed, and configurations of the analysis portion are well known. The detected sizes noted in Table A may be the size of the LPD or may be the size of the defect or abnormality found by conversion as described above. Specific examples of commercially available laser surface inspection devices may include the Surfscan series SP1, SP2, SP3, or SP5 manufactured by KLA-Tencor Corporation, for example. These devices are examples only, and other laser surface inspection devices may also be used.

<Distinguishing a Defect or Abnormality>

In the above evaluation method described above, the type of defect or foreign substance measured as the LPD is distinguished according to the distinguishing standards shown in Table A below, based on the results of the LPD measurements conducted both before and after the cleaning process. Details of the investigation by the inventors in this regard are as previously described.

TABLE A

| Measurement Result | Type of Defect or Foreign Substance |
| --- | --- |
| LPD where a detection size X before the cleaning process and a detection size Y after the cleaning process fulfill the relationship X < Y | PID |
| LPD that is detected before the cleaning process but is not detected after the cleaning process | Normal particle |
| LPD where a detection size X before the cleaning process and a detection size Y after the cleaning process fulfill the relationship X ≥ Y | Firmly-adherent particle |

Figure 2:
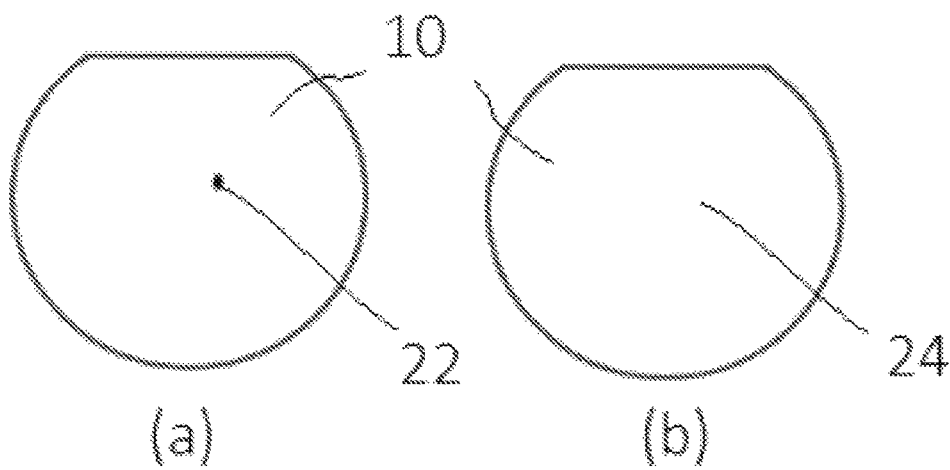
FIGS. 2(a) and 2(b) graphically illustrate measurement determination of a normal particle.
Figure 3:
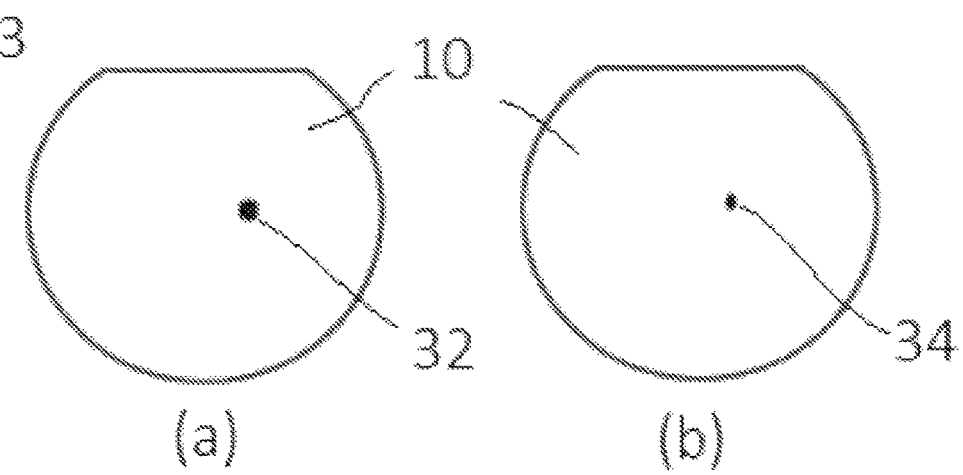
FIGS. 3(a) and 3(b) graphically illustrate measurement determination of a firmly adherent particle.

FIGS. 1(a)-1(b), 2(a)-2(b), and 3(a)-3(b) graphically illustrate cases in which "PID," "normal particles," and "firmly-adherent particles" on a surface of a semiconductor wafer are determined, respectively. In FIGS. 1(a)-(b), the size of LPD (14) on the surface of the semiconductor wafer (10) after the cleaning process is larger than the size of LPD (12) on the surface of the semiconductor wafer (10) before the cleaning process, indicating that the LPD was a PID. In FIGS. 2(a)-(b), LPD (24) on the surface of the semiconductor wafer (10) is non-existent after the cleaning process, compared with LPD (22) on the surface of the semiconductor wafer (10) before the cleaning process, indicating that the LPD was a normal particle. In FIGS. 3(a)-(b), LPD (34) on the surface of the semiconductor wafer (10) after the cleaning process is smaller than LPD (32) on the surface of the semiconductor wafer (10) before the cleaning process, indicating that the LPD was a firmly adherent particle.

"PID," "normal particles," and "firmly-adherent particles" can be distinguished according to the evaluation method described above.

[Semiconductor Wafer Manufacturing Method]

One aspect of the present invention relates to a manufacturing method of a semiconductor wafer having a polished surface, i.e., a polished wafer, which includes mirror polishing a semiconductor wafer to form a polished surface; performing a cleaning process of cleaning the semiconductor wafer provided with the polished surface with one or more kinds of cleaning liquid; measuring an LPD of the polished surface both before and after the cleaning process with a laser surface inspection device; and distinguishing the type of defect or foreign substance measured as the LPD, based on measurement results obtained in the above measuring, according to distinguishing standards shown in Table A, and further includes subjecting a semiconductor wafer that is judged as an acceptable product based on the results of the distinguishing to a preparation process that delivers the semiconductor wafer as a finished product.

A polished wafer can be manufactured by manufacturing processes that include cutting (slicing) a wafer from a semiconductor ingot such as a silicon single crystal ingot, chamfering, rough polishing (lapping, for example), etching, mirror polishing (finishing polishing), and a cleaning process performed either between the processing processes or after the processing processes. In the above manufacturing method, LPD measurement is performed on the polished surface (surface which has been mirror polished) of the polished wafer both before and after the cleaning process. Regarding this cleaning process, the previous descriptions related to the cleaning process in the above evaluation method can be referred. In addition, in one aspect, a cleaning process may be further included prior to the cleaning process performed before the LPD measurement. Also regarding this cleaning process that may be further included, the previous descriptions related to the cleaning process in the above evaluation method can be referred.

In the above manufacturing method, the type of defect or foreign substance measured as the LPD is distinguished, based on the results of the LPD measurements conducted both before and after the cleaning step, according to the distinguishing standards shown in Table A above. Then, a semiconductor wafer that is judged as an acceptable product based on the results of the distinguishing obtained in this way is subjected to a preparation process that delivers the semiconductor wafer as a finished product. Judgment standards for judging an acceptable product are not particularly limited and may be defined as desired in accordance with a level of cleaning as needed in the cleaning process that is performed between the two LPD measurements and a level of PID reduction as needed for the semiconductor wafer finished product. By conducting the judgment of acceptability in this way, a semiconductor wafer with few particles or PID can be provided to market reliably. In addition, in the above manufacturing method, by carrying out an LPD measurement that can be performed as a non-destructive inspection, acceptability can be judged during a round of the manufacturing processes performed up to delivery of the polished wafer. Examples of preparation for delivery as a semiconductor wafer finished product may include post-processing such as a further cleaning process, packaging, or the like, for example.

On the other hand, a semiconductor wafer that is judged as an unacceptable product based on the judgment results can be subjected to a reprocessing process. For example, with a semiconductor wafer that is judged as an unacceptable product because the number of LPD that are distinguished as PID exceeds an allowed level for an acceptable product, the semiconductor wafer can undergo a polishing process as a reprocessing process to reduce PID. In addition, with a semiconductor wafer that is judged as an unacceptable product because the number of LPD that are distinguished as firmly-adherent particle exceeds an allowed level for an acceptable product, the semiconductor wafer can undergo a cleaning process as a reprocessing process to reduce the firmly-adherent particles. In this way, a semiconductor wafer that is judged as an unacceptable product is subjected to a preparation process for delivery as a finished product after going through the reprocessing process, whereby a semiconductor wafer with few particles or PID can be provided to market reliably. Commonly known techniques for polishing and cleaning a semiconductor wafer can be applied for the polishing process and cleaning process carried out as the reprocessing process.

[Semiconductor Wafer Manufacturing Process Management Method]

One aspect of the present invention relates to a semiconductor wafer manufacturing process management method, where a manufacturing process to be managed includes performing a polishing process of subjecting a semiconductor wafer to a polishing treatment to form a polished surface; and performing a cleaning process of cleaning the semiconductor wafer provided with the polished surface with one or more kinds of cleaning liquid, and the method includes measuring an LPD of the polished surface both before and after the cleaning process with a laser surface inspection device; and distinguishing the type of defect or foreign substance measured as the LPD, based on measurement results obtained in the above measuring, according to distinguishing standards shown in Table A, and further includes judging the necessity of one or both of managing the polishing process and managing the cleaning process on the basis of the results of the above distinguishing.

The manufacturing process to be managed may be a manufacturing process that is ordinarily performed as a process of manufacturing a polished wafer. In the above management method, a polished wafer that is manufactured by a manufacturing process to be managed is subjected to LPD measurement both before and after the cleaning process. Regarding this cleaning process, the previous descriptions related to the cleaning process in the above evaluation method can be referred. In addition, in one aspect, a cleaning process may be further included prior to the cleaning process performed before the LPD measurement. Also regarding this cleaning process that may be further included, the previous descriptions related to the cleaning process in the above evaluation method can be referred.

Regarding the cleaning process, the previous descriptions related to the cleaning process can be referred. In addition, in one aspect, a cleaning process may be further included prior to the cleaning process performed before the LPD measurement. Also regarding this cleaning process that may be further included, the previous descriptions related to the cleaning process can be referred.

Management of the polishing process includes modification of various polishing conditions, such as switching polishing slurry, modifying the composition of a polishing slurry, switching polishing pad, modifying the type of polishing pad, modifying operation conditions of a polishing device, and the like. Management of the cleaning process includes modification of various cleaning conditions, such as switching cleaning liquid, modifying the composition of a cleaning liquid, modifying the amount of cleaning time, modifying the number of times a wafer is cleaned, modifying operation conditions of a cleaning device, and the like.

In the above management method, the type of defect or foreign substance measured as the LPD is distinguished, based on the results of the LPD measurements conducted both before and after the cleaning step, according to the distinguishing standards shown in Table A above. Then, the necessity of one or both of managing the polishing process and managing the cleaning process is judged based on the distinguishing results obtained in this way. For example, when the number of LPD that are distinguished as PID exceeds an allowed level for an acceptable product, a polished wafer having few PID after management of the polishing process can be manufactured by judging that management of the polishing process is necessary and managing the polishing process. On the other hand, when the number of LPD that are distinguished as firmly-adherent particle exceeds an allowed level for an acceptable product, a polished wafer having few particles after management of the cleaning process can be manufactured by judging that management of the cleaning process is necessary, and managing the cleaning process by, for example, switching the cleaning liquid.

EXAMPLES

Below, the present invention is further described based on Examples. However, the present invention is not limited to the aspects illustrated in Examples.

Hereafter, the Surfscan series SP5 manufactured by KLA-Tencor Corporation was used as the laser surface inspection device. The KLA-Tencor Corporation Surfscan series SP5 has one incident system and, as the one incident system, includes an ultraviolet light source that obliquely irradiates the surface of the wafer to be evaluated with light. As a light receiving system, the Surfscan series SP5 has three light receiving systems: a dark-field narrow oblique (DNO) channel, a dark-field wide1 oblique (DW1O) channel, and a dark-field wide2 oblique (DW2O) channel. The DW1O channel and DW2O channel are light receiving systems on a low-angle side relative to the DNO channel. The LPD measurement below was carried out using the DW1O channel as the light receiving system, but the DNO channel and DW2O channel can also be used.

In the following, a defect or abnormality is detected as an LPD by scanning the incident light over the entire region of the polished surface of the polished wafer to be evaluated and, based on the size of the LPD, the size is converted by an analyzer provided to the laser surface inspection device and the size of the defect or abnormality (detected size) is calculated.

The HF cleaning described below is cleaning with hydrofluoric acid having a hydrogen fluoride concentration of 0.05 to 5 mass %, and the SC-1 cleaning described below is cleaning with an SC1 liquid having a ratio of ammonia water with an ammonia concentration of 25 to 35 mass % to hydrogen peroxide solution with an $H_2O_2$ concentration of 25 to 35 mass % to $H_2O$ of 0.5:1:10 (volume ratio). Each cleaning was performed by immersing the entire wafer to be cleaned in each respective cleaning liquid for 0.5 to 10 minutes.

A silicon single crystal wafer having a polished surface formed by mirror polishing (polished wafer with a diameter of 300 mm) was prepared and the polished wafer was subjected to a first cleaning process (HF cleaning and SC-1 cleaning performed in that order).

A first LPD measurement was performed on the polished surface of the post-first cleaning process polished wafer using the laser surface inspection device.

The post-first LPD measurement polished wafer was subjected to a second cleaning process (HF cleaning and SC-1 cleaning performed in that order).

A second LPD measurement is performed on the polished surface of the post-second cleaning process polished wafer using the laser surface inspection device.

The polished surface of the post-second LPD measurement polished wafer was observed with a scanning electron microscope (SEM) and a defect or abnormality on the polished surface was categorized as a PID or particle. Morphological observation with the SEM can distinguish between PID and particles.

Based on LPD coordinate data, an LPD that was detected in the first LPD measurement but was not detected in the second LPD measurement and an LPD that was detected in both the first LPD measurement and the second LPD measurement were respectively specified, and in accordance with the distinguishing standards shown in Table A, various kinds of LPD were distinguished as one of a PID, a firmly-adherent particle, and a normal particle.

In addition, as an example of distinguishing defects and foreign substances based on SEM observation, a PID, a firmly-adherent particle, and a normal particle were distinguished in accordance with the distinguishing standards below, based on the LPD coordinate data and the results of distinguishing the type and specifying the position of the defect or foreign substance according to the SEM observation. An issue, that was detected as an LPD in the first LPD measurement but was not detected in the SEM observation, was classified as a "normal particle." Of the defects and foreign substances detected as an LPD in both the first LPD measurement and the second LPD measurement, an issue, that was distinguished as a particle by the SEM observation, was classified as a "firmly-adherent particle." Of the defects and foreign substances detected as an LPD in both the first LPD measurement and the second LPD measurement, an issue, that was distinguished as a PID by the SEM observation, was classified as a "PID."

Upon comparing the results obtained through the LPD measurement and the results obtained through the SEM observation, 86.5% of the defects or abnormalities classified as PID by the SEM observation were classified as PID in the LPD measurement as well, 96.4% of defects or abnormalities classified as firmly-adherent particles by the SEM observation were classified as firmly-adherent particles in the LPD measurement as well, and 99.3% of defects or abnormalities classified as normal particles by the SEM observation were classified as normal particles in the LPD measurement as well.

Based on the above results, it is possible to confirm that PID, firmly-adherent particles, and normal particles can be accurately distinguished with the above evaluation method with the distinguishing standards shown in Table A. Respective morphological observation of defects and abnormalities present on the polished surface using an SEM and distinguishing the types thereof requires a long time. In contrast, distinguishing based on an LPD measurement with a laser surface inspection device can be performed without requiring a similarly long time.

The present invention is useful in the field of manufacturing polished wafers.

The invention claimed is:
1. An evaluation method of a semiconductor wafer,
wherein a semiconductor wafer to be evaluated has a polished surface, and the method comprises:

a cleaning process of cleaning the semiconductor wafer with one or more kinds of cleaning liquid;

measuring an LPD of the polished surface both before and after the cleaning process with a laser surface inspection device; and distinguishing the type of defect or foreign substance measured as the LPD, based on measurement results obtained in the measuring, according to the following distinguishing standards

TABLE A

| Measurement Result | Type of Defect or Foreign Substance |
|---|---|
| LPD where a detection size X before the cleaning process and a detection size Y after the cleaning process fulfill the relationship X < Y | PID |
| LPD that is detected before the cleaning process but is not detected after the cleaning process | Normal particle |
| LPD where a detection size X before the cleaning process and a detection size Y after the cleaning process fulfill the relationship X ≥ Y. | Firmly-adherent particle |

2. The evaluation method of a semiconductor wafer according to claim 1, wherein the cleaning process is a cleaning process performed with a cleaning liquid containing one or more kinds of inorganic acid.

3. The evaluation method of a semiconductor wafer according to claim 1, wherein the cleaning process comprises HF cleaning and SC-1 cleaning.

4. A manufacturing method of a semiconductor wafer having a polished surface, comprising:

mirror polishing a semiconductor wafer to form a polished surface;

performing a cleaning process of cleaning the semiconductor wafer provided with the polished surface with one or more kinds of cleaning liquid;

measuring an LPD of the polished surface both before and after the cleaning process with a laser surface inspection device; and distinguishing the type of defect or foreign substance measured as the LPD, based on measurement results obtained in the measuring, according to the following distinguishing standards:

TABLE A

| Measurement Result | Type of Defect or Foreign Substance |
|---|---|
| LPD where a detection size X before the cleaning process and a detection size Y after the cleaning process fulfill the relationship X < Y | PID |
| LPD that is detected before the cleaning process but is not detected after the cleaning process | Normal particle |

TABLE A-continued

| Measurement Result | Type of Defect or Foreign Substance |
|---|---|
| LPD where a detection size X before the cleaning process and a detection size Y after the cleaning process fulfill the relationship X ≥ Y | Firmly-adherent particle | and further comprising:

subjecting a semiconductor wafer that is judged as an acceptable product based on the results of the distinguishing to a preparation process that delivers the semiconductor wafer as a finished product.

5. The manufacturing method of a semiconductor wafer according to claim 4, further comprising:

subjecting to a reprocessing process a semiconductor wafer that is judged as an unacceptable product as a result of the distinguishing; and subjecting a post-reprocessing process semiconductor wafer to a preparation process that delivers the semiconductor wafer as a finished product.

6. The manufacturing method of a semiconductor wafer according to claim 5, wherein the reprocessing process is at least one process selected from the group consisting of a polishing process and a cleaning process.

7. A semiconductor wafer manufacturing process management method, wherein a manufacturing process to be managed comprises:

performing a polishing process of mirror polishing a semiconductor wafer to form a polished surface; and performing a cleaning process of cleaning the semiconductor wafer provided with the polished surface with one or more kinds of cleaning liquid, and the method comprises:

measuring an LPD of the polished surface both before and after the cleaning process with a laser surface inspection device; and distinguishing the type of defect or foreign substance measured as the LPD, based on measurement results obtained in the measuring, according to the following distinguishing standards:

TABLE A

| Measurement Result | Type of Defect or Foreign Substance |
|---|---|
| LPD where a detection size X before the cleaning process and a detection size Y after the cleaning process fulfill the relationship X < Y | PID |
| LPD that is detected before the cleaning process but is not detected after the cleaning process | Normal particle |
| LPD where a detection size X before the cleaning process and a detection size Y after the cleaning process fulfill the relationship X ≥ Y | Firmly-adherent particle | and the method further comprises:

judging the necessity of one or both of managing the polishing process and managing the cleaning process on the basis of the results of the distinguishing.

8. The semiconductor wafer manufacturing process management method according to claim 7,
   wherein management of the cleaning process comprises switching the one or more kinds of cleaning liquid used in the cleaning process.

9. The evaluation method of a semiconductor wafer according to claim 2,
   wherein the cleaning process comprises HF cleaning and SC-1 cleaning.

* * * * *